(12) United States Patent
Winters et al.

(10) Patent No.: US 9,317,422 B1
(45) Date of Patent: Apr. 19, 2016

(54) SECURE ERASE OF DATA IN ELECTRONIC DEVICE

(71) Applicant: FOREMAY, INC., Pasadena, CA (US)

(72) Inventors: Jack Winters, Middletown, NJ (US); Haining Fan, Brea, CA (US)

( * ) Notice: Subject to any disclaimer, the term of this patent is extended or adjusted under 35 U.S.C. 154(b) by 649 days.

(21) Appl. No.: 13/573,734

(22) Filed: Oct. 3, 2012

Related U.S. Application Data

(60) Provisional application No. 61/542,339, filed on Oct. 3, 2011.

(51) Int. Cl.
*H04L 29/06* (2006.01)
*G06F 12/02* (2006.01)

(52) U.S. Cl.
CPC .................................. *G06F 12/0246* (2013.01)

(58) Field of Classification Search
CPC .. G06F 2221/2143; G06F 21/86; H01L 23/57
USPC ............................................................ 726/35
See application file for complete search history.

(56) References Cited

U.S. PATENT DOCUMENTS

| | | | | |
|---|---|---|---|---|
| 5,826,009 | A * | 10/1998 | Feng | 726/33 |
| 2005/0152177 | A1* | 7/2005 | McClure | 365/154 |
| 2011/0138477 | A1* | 6/2011 | Jones et al. | 726/27 |
| 2012/0226910 | A1* | 9/2012 | Hutzler et al. | 713/182 |

* cited by examiner

*Primary Examiner* — Jason K Gee
(74) *Attorney, Agent, or Firm* — Porzio, Bromberg & Newman, P.C.

(57) ABSTRACT

A method of secure erase of an electronic device that applies a predetermined voltage to a device. The voltage is selected to be high enough to quickly destroy all data cells of the electronic device, but not high enough to destroy lines to the data cells of the electronic device. Accordingly, since the voltage is too low to destroy the word or bit lines, the predetermined voltage is applied to every data cell using the word or bit lines such that all data is removed. The present invention has the advantage of quickly, reliably, and permanently removing all of the data from the electronic device. The predetermined high voltage can differ for different types of SSDs.

17 Claims, 5 Drawing Sheets

SECURE ERASE OF DATA IN ELECTRONIC DEVICE

CROSS REFERENCE TO RELATED APPLICATION

This application claims the benefit of U.S. Provisional Patent Application No. 61/542,339, filed Oct. 3, 2011, the entirety of which is hereby incorporated by reference into this application.

BACKGROUND OF THE INVENTION

Data security is extremely important in many storage applications. When data is no longer needed on an electronic storage device, or in the event of the theft of the device, the data must be permanently removed. This removal process must make it impossible to ever recover the data, and needs to be done very quickly and reliably. In most conventional devices, and in Solid State Drives (SSDs) in particular, just deleting the data only removes its name from the directory or file table. The user data remains until overwritten by new data. Also, reformatting the SSD also leaves data intact. Furthermore, just writing over the data once does not completely erase the previous data as information as to the previous data can still exist as small variations in the bit levels. Indeed, secure erasure techniques, such as those developed by the government require writing over the data multiple times to remove the data. Accordingly, there is a need to erase all user data in allocated blocks, file tables, and data in reallocated defective blocks completely, quickly, and reliably.

Conventional techniques for data sanitization have been described. One technique is Secure Erase ATA (Advanced Technology Attachment) command, to a target storage device which overwrites all data in allocated blocks, file tables, and data in reallocated defective blocks. Overwriting can be done to meet a variety of requirements established by different standard organizations, with each organization setting its own method of multiple overwriting with different sequences. However, writing to all blocks multiple times takes a significant amount of time, e.g., 5 seconds per 32 GB of data, which is too long for many applications.

Another conventional technique that is much faster is to use a drive with self-encryption, and just overwrite the encryption key. This technique may increase the speed of data sanitization, but the data remains on the drive. Accordingly, although the data may have been encrypted with advantageous encryption algorithms, there is no guarantee that the encryption method may never be broken.

Another conventional method that has improved performance speed is to apply a very high voltage to the input of the SSD, thus destroying the SSD. However, applying a very high voltage to the input of the SSD will typically destroy only the input circuitry since this circuitry quickly vaporizes, resulting in broken connections that fail to apply the very high voltage to all the data blocks. Accordingly, there is the potential to read data within blocks of the SSD not having the very high voltage applied.

It is desirable to provide a fast, reliable, permanent removal of all data on a storage device.

SUMMARY OF THE INVENTION

The present invention provides a method of secure erase of data in an electronic device that applies a predetermined voltage to the electronic device. The voltage is selected to be high enough to quickly destroy all data cells of the electronic device, but not high enough to destroy lines of the electronic device. Accordingly, since the voltage is too low to destroy the word or bit lines, the predetermined voltage is applied to every data cell using the word or bit lines such that all data is removed. The present invention has the advantage of quickly, reliably, and permanently removing all of the data from the electronic device. The predetermined high voltage range of voltages can differ for different types of SSDs.

In one embodiment, the predetermined voltage is applied to word and/or bit lines of Solid State Drives (SSDs). The predetermined voltage includes, but is not limited to 3.3V, 5.0V, 12V, 24V, 36V, 48V, 60V, 72V, 84V and any other voltage between 3.3V and 84V. Flash memory in SSDs typically uses blocks composed of thousands of non-volatile memory cells, such as NAND cells, with each block using a common word and bit line. The method of the present invention for application of the predetermined voltage to the word or bit line expeditiously applies the voltage to all NAND cells for destruction, and as long as the voltage is selected to be low enough so that the word and bit lines remain intact but high enough to reliably destroy all NAND cells quickly, the method of the present invention reliably and quickly destroys, i.e., securely erases, all data.

In another embodiment, an inverted voltage is applied to the electronic device by connecting a NAND ground connect to the predetermined voltage and connecting the NAND VCC to ground. This method also quickly destroys all NAND cells but keeps the word and/or bit lines intact, as well as the IC power supply pin (VCC) and ground lines.

The invention will be more fully described by reference to the following drawings.

DETAILED DESCRIPTION

Figure 1:
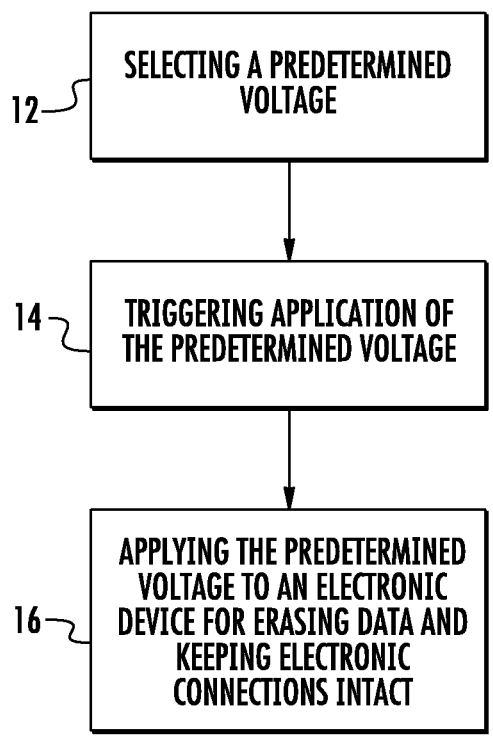
FIG. 1 is a flow diagram illustration of a method of secure erase of an electronic device.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a flow diagram illustration of a method of secure erase of an electronic device 10 in accordance with the details of the present invention. In block 12, a predetermined voltage is selected for an electronic device. The predetermined voltage is selected to be high enough to reliably destroy all data of the electronic device yet low enough to keep electronic connections of the electronic device intact.

In one embodiment, the predetermined voltage is applied to word and/or bit lines of Solid State Drives (SSDs). In one embodiment, the predetermined voltages are in the range of about 3.3 V to about 84 V. Suitable predetermined voltages can include, but not be limited to, 3.3V, 5.0V, 12V, 24V, 36V, 48V, 60V, 72V, and 84V. In another embodiment, an inverted voltage is applied to the electronic device by connecting a NAND ground connect to the predetermined voltage and connecting the NAND VCC to ground.

In block 14, application of the predetermined voltage is triggered.

Triggering of the application of the predetermined voltage of block 14 is done by any of a number of means including an external switch or button that is manually set when sanitization of an electronic device is required or that is set when the electronic device is removed from a system.

Alternatively, triggering the application of the predetermined voltage can be performed automatically such as by a software implementation. For example, the switch can be activated by receiving an input signal or command at a software module. In one embodiment, a mobile phone sends a signal that is received by a software module. If the signal is sent from a particular phone number or with a particular PIN, the switch is set for triggering the application of the predetermined voltage. In an alternate embodiment, a network can forward a signal or command to a software module. In an alternative embodiment, GPS or assisted GPS can be used for triggering the application of the predetermined voltage when the electronic device is moved from a particular location or outside a given area.

In an alternate embodiment, a sensor can be used for triggering the application of the predetermined voltage when the sensor detects a shock to the electronic device above a certain level or movement of the electronic device beyond a certain level. In an alternate embodiment, unauthorized tampering or opening of a housing of the electronic device, such as an enclosure of a NAND flash and other non-volatile-memory-based solid state drives, can be used for triggering the application of the predetermined voltage.

In block 16, the predetermined voltage is applied to the electronic device for erasing the data, i.e., destroying the memory cell, yet keeping the electronic connections intact.

Figure 2:
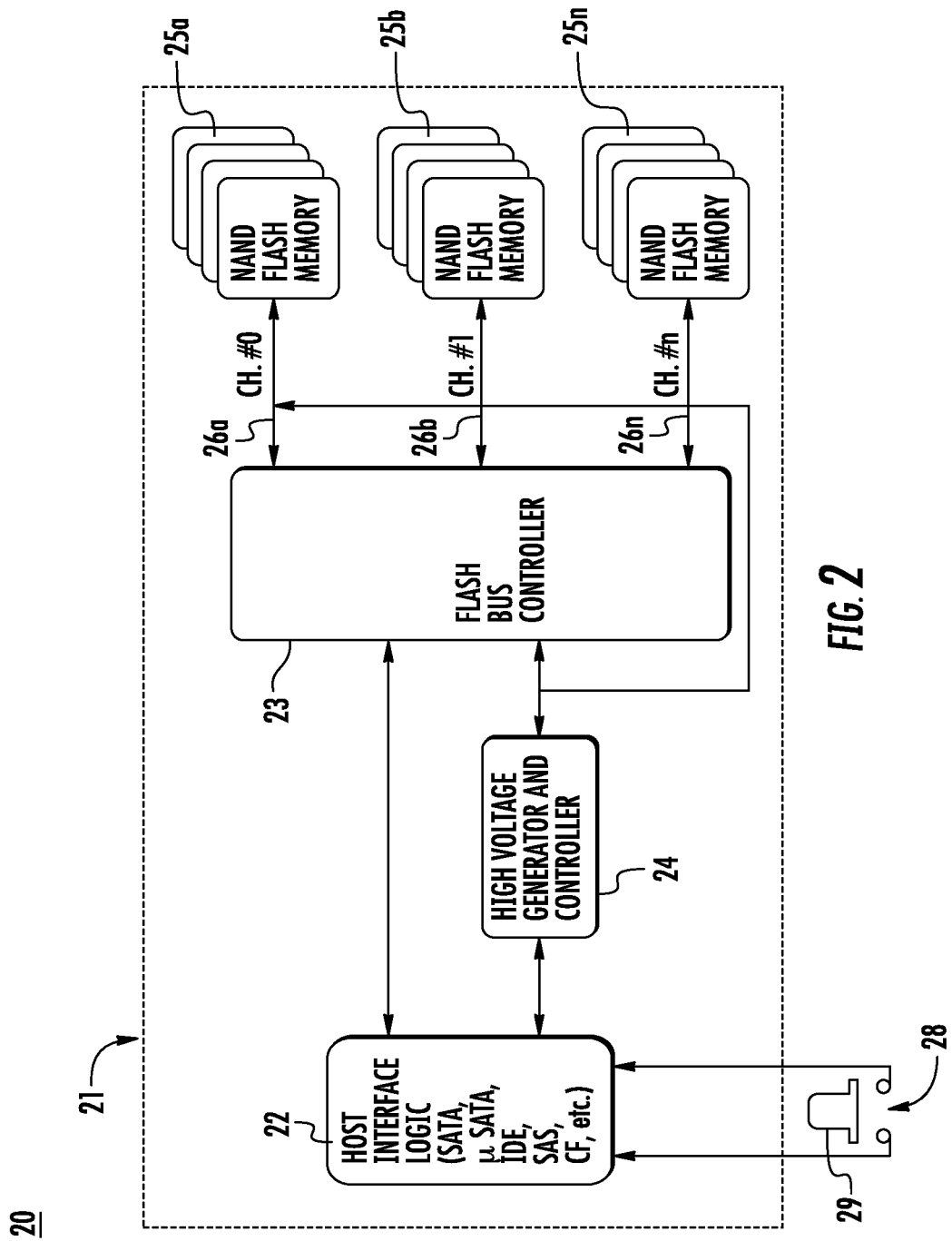
FIG. 2 is a schematic diagram of a system for secure erase of an electronic device.

FIG. 2 is a schematic diagram of a system for secure erase of an electronic device 20. Electronic device 21 can include host interface logic 22 which interfaces with flash bus controller 23 and voltage generator and controller 24. Host logic interface 22 can be, for example, a Serial ATA (SATA), micro SATA, integrated drive electronic device (IDE), serial attached SCSI (SAS) and compact flash (CF). Flash bus controller 23 controls a plurality of NAND flash memory cells 25a-25n over respective channels 26a-26n. Voltage generator and controller 24 applies a selected predetermined voltage to channels 26a-26n for applying the predetermined selected voltage to flash memory cells 25a-25n over word lines and bit lines. Switch 28 is coupled to host interface logic 22. Button 29 can be used to activate switch 28.

Figure 3:
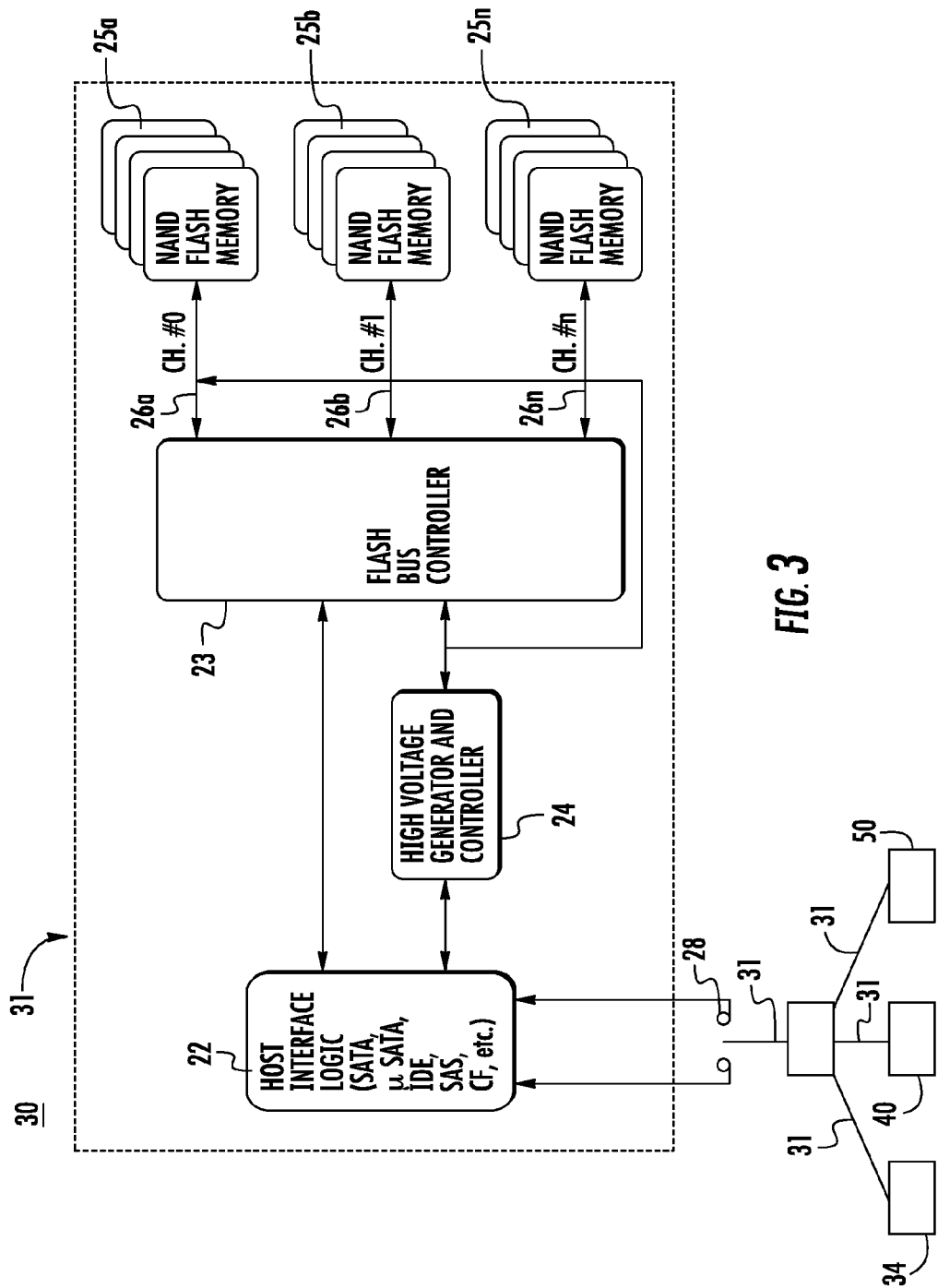
FIG. 3 is a schematic diagram of an alternate system for secure erase of an electronic device.

Alternatively, switch 28 can be activated by receiving command signal 31 at software module 32 of system for secure erase of an electronic device 30, as shown in FIG. 3. In one embodiment command signal 31 is sent over network 34 to software module 32. Alternatively, signal 31 is sent by mobile phone 40. Alternatively, GPS 50 can send signal 31.

Figure 4:
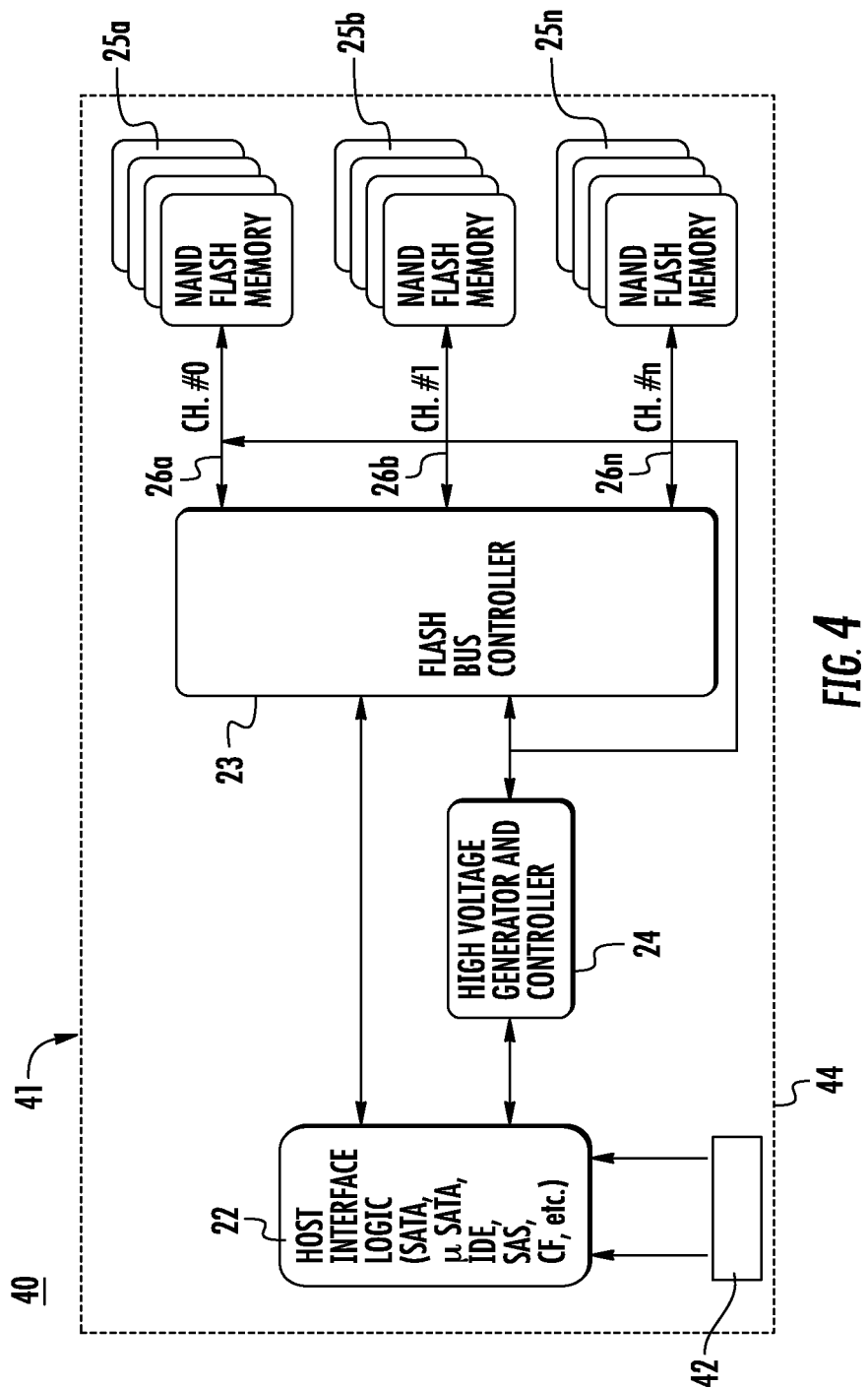
FIG. 4 is a schematic diagram of an alternate system for secure erase of an electronic device.

FIG. 4 is a schematic diagram of system for secure erase of an electronic device 40. Sensor 42 can be coupled to electronic device 41. Sensor 42 can be used for triggering the application of the predetermined voltage when sensor 42 detects a shock to electronic device 41 above a certain level or movement of electronic device 41 beyond a certain level. In an alternate embodiment, unauthorized tampering or opening of a housing 44 of electronic device 41 triggers sensor 42.

Electronic device 31 and electronic device 41 can be a SSD, flash drive or other electronic storage device.

Figure 5:
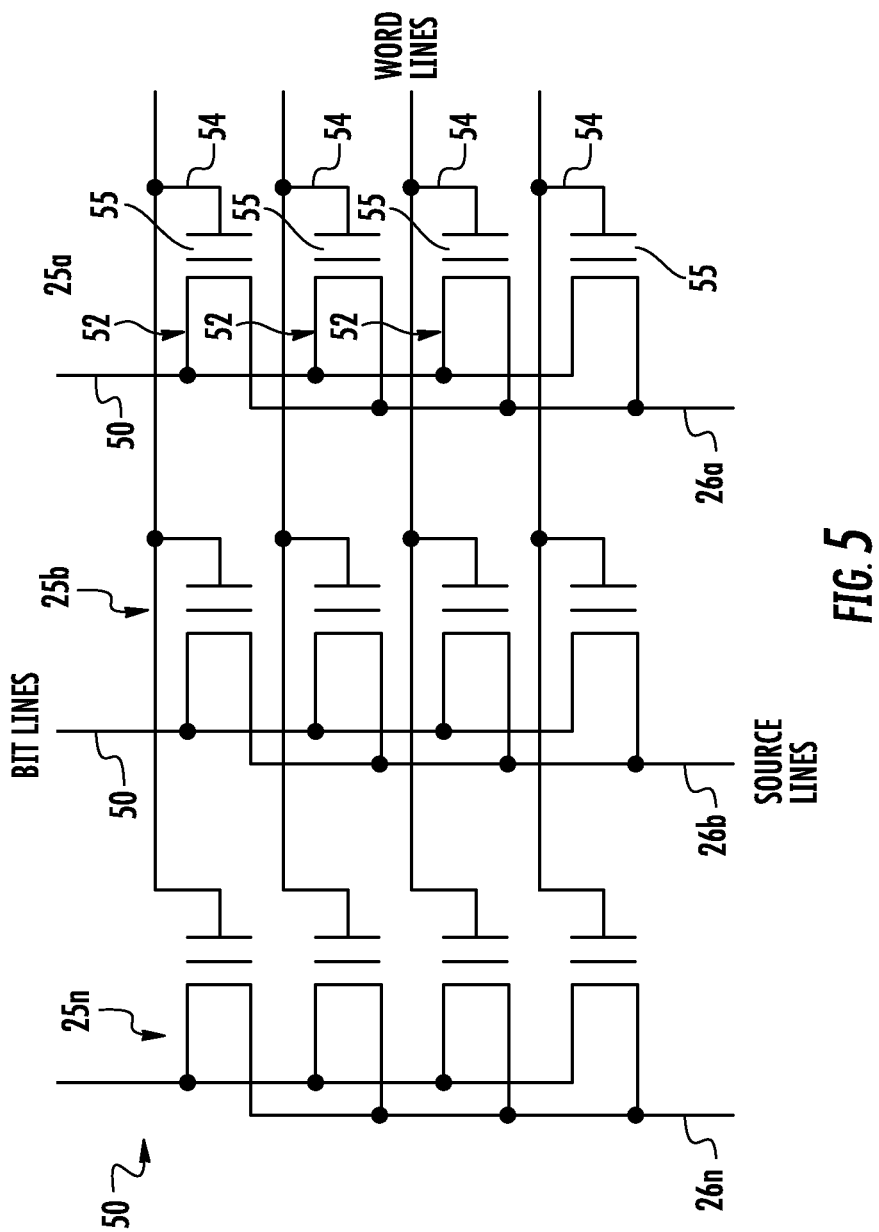
FIG. 5 is a schematic circuit diagram of flash memory cells.

FIG. 5 shows the flash memory with the bit and word lines. Channels 26a-26n connect to bit lines 50 of respective flash memory cells 25a-25n. Bit lines 50 connect to flash memory cells 52. Word lines 54 are connected to gates 55 of flash memory cells 52. Current applied to channels 26a-26n at the predetermined selected voltage flows through memory cells 54 over bit lines 50 and word lines 54. An inverted voltage is applied to flash memory cells 52 by connecting a NAND ground connect to the predetermined voltage and connecting the NAND VCC to ground.

Embodiments of the present invention may be implemented in connection with a special purpose or general purpose computer that include both hardware and/or software components.

Embodiments may also include physical computer-readable media and/or intangible computer-readable media for carrying or having computer-executable instructions, data structures, and/or data signals stored thereon. Such physical computer-readable media and/or intangible computer-readable media can be any available media that can be accessed by a general purpose or special purpose computer. By way of example, and not limitation, such physical computer-readable media can include RAM, ROM, EEPROM, CD-ROM or other optical disk storage, magnetic disk storage or other magnetic storage devices, other semiconductor storage media, or any other physical medium which can be used to store desired data in the form of computer-executable instructions, data structures and/or data signals, and which can be accessed by a general purpose or special purpose computer. Within a general purpose or special purpose computer, intangible computer-readable media can include electromagnetic means for conveying a data signal from one part of the computer to another, such as through circuitry residing in the computer.

When information is transferred or provided over a network or another communications connection (either hardwired, wireless, or a combination of hardwired or wireless) to a computer, hardwired devices for sending and receiving computer-executable instructions, data structures, and/or data signals (e.g., wires, cables, optical fibers, electronic circuitry, chemical, and the like) should properly be viewed as physical computer-readable mediums while wireless carriers or wireless mediums for sending and/or receiving computer-executable instructions, data structures, and/or data signals (e.g., radio communications, satellite communications, infrared communications, and the like) should properly be viewed as intangible computer-readable mediums. Combinations of the above should also be included within the scope of computer-readable media.

Computer-executable instructions include, for example, instructions, data, and/or data signals which cause a general purpose computer, special purpose computer, or special purpose processing device to perform a certain function or group of functions. Although not required, aspects of the invention have been described herein in the general context of computer-executable instructions, such as program modules, being executed by computers, in network environments and/or non-network environments. Generally, program modules include routines, programs, objects, components, and content structures that perform particular tasks or implement particular abstract content types. Computer-executable instructions, associated content structures, and program modules represent examples of program code for executing aspects of the methods disclosed herein.

Embodiments may also include computer program products for use in the systems of the present invention, the computer program product having a physical computer-readable medium having computer readable program code stored thereon, the computer readable program code comprising computer executable instructions that, when executed by a processor, cause the system to perform the methods of the present invention.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A method of erasing of data stored in memory cells in an electronic device comprising the steps of:
   selecting a predetermined voltage;
   triggering application of the predetermined voltage; and
   applying the predetermined voltage to the electronic device, the electronic device is a solid state drive (SSD) comprising a plurality of NAND cells using common word and bit lines
   wherein the predetermined voltage is selected to be high enough to destroy all the NAND cells of the electronic device and low enough to keep the word and bit lines to the NAND cells intact and is in a range from 3.3V to 84V and wherein the application of the voltage destroys the NAND cells and keeps the word and bit lines intact.

2. The method of claim 1 wherein the predetermined voltage is selected to be 3.3V, 5.0V, 12V, 24V, 36V, 48V, 60V, 72V, or 84V.

3. The method of claim 1 wherein the triggering application of the predetermined voltage is performed manually.

4. The method of claim 1 wherein the triggering application of the predetermined voltage is performed automatically.

5. The method of claim 4 wherein a signal is sent from a mobile phone for automatically triggering the application of the predetermined voltage.

6. The method of claim 4 wherein a GPS or assisted GPS is used for automatically triggering the application of the predetermined voltage when the electronic device is moved from a particular location or outside a given area.

7. The method of claim 4 wherein a sensor is used for automatically triggering the application of the predetermined voltage when the sensor detects a shock to the electronic device above a certain level or movement of the electronic device beyond a certain level.

8. The method of claim 4 wherein tampering or opening of a housing of the electronic device is used for automatically triggering the application of the predetermined voltage.

9. A system of erasing of data stored in memory cells in an electronic device comprising:
   means for triggering application of a predetermined voltage manually or automatically; and
   means for applying the predetermined voltage to the electronic device, the electronic device is a solid state drive (SSD) comprising a plurality of NAND cells using common word and bit lines
   wherein the predetermined voltage is selected to be high enough to destroy all the NAND cells containing the data of the electronic device and low enough to keep the word and bit lines to the NAND cells intact and wherein the predetermined voltage is in a range from 3.3V to 84V and wherein the application of the voltage destroys the NAND cells and keeps the word and bit lines intact.

10. The system of claim 9 wherein the predetermined voltage is 3.3V, 5.0V, 12V, 24V, 36V, 48V, 60V, 72V, or 84V.

11. The system of claim 9 wherein the means for triggering application of the predetermined voltage is manually performed by a switch.

12. The system of claim 9 wherein the switch is operated manually.

13. The system of claim 11 wherein a signal is sent from a mobile phone for automatically triggering the switch.

14. The system of claim 11 wherein a GPS or assisted GPS is used for automatically triggering the switch when the electronic device is moved from a particular location or outside a given area.

15. The system of claim 9 wherein a sensor coupled to the electronic device, the sensor is used for automatically triggering the application of the predetermined voltage wherein the sensor detects a shock to the electronic device above a certain level or movement of the electronic device beyond a certain level.

16. The system of claim 15 wherein the sensor is triggered by tampering or opening of a housing of the electronic device for automatically triggering the application of the predetermined voltage.

17. The system of claim 9 wherein the predetermined voltage is connected to the NAND ground connection and a NAND VCC is connected to ground.

* * * * *